(12) United States Patent
O'Connor

(10) Patent No.: US 12,022,630 B2
(45) Date of Patent: Jun. 25, 2024

(54) MODULAR WALL MOUNT ENCLOSURE

(71) Applicant: Hubbell Incorporated, Shelton, CT (US)

(72) Inventor: Douglas Paul O'Connor, Richmond, RI (US)

(*) Notice: Subject to any disclaimer, the term of this patent is extended or adjusted under 35 U.S.C. 154(b) by 0 days.

(21) Appl. No.: 17/831,680

(22) Filed: Jun. 3, 2022

(65) Prior Publication Data

US 2022/0295652 A1    Sep. 15, 2022

Related U.S. Application Data

(63) Continuation of application No. 16/502,223, filed on Jul. 3, 2019, now Pat. No. 11,375,627.

(Continued)

(51) Int. Cl.
*H02G 3/08* (2006.01)
*H05K 5/00* (2006.01)
*H05K 5/02* (2006.01)

(52) U.S. Cl.
CPC .......... *H05K 5/0217* (2013.01); *H02G 3/081* (2013.01); *H05K 5/0004* (2013.01)

(58) Field of Classification Search
CPC .... H02G 3/081; H05K 5/2017; H05K 5/0004; B65D 11/188; B65D 21/086;

(Continued)

(56) References Cited

U.S. PATENT DOCUMENTS 1,066,215 A    7/1913   Murray
1,326,498 A    12/1919  Hayden
(Continued)

FOREIGN PATENT DOCUMENTS

CN    102065661 A    5/2011
CN    103037652 A    4/2013
(Continued)

OTHER PUBLICATIONS

Extended European Search Report issued in corresponding European Patent Application No. 19831208.4, dated Feb. 10, 2022 (8 pages).

(Continued)

*Primary Examiner* — Stephen J Castellano
(74) *Attorney, Agent, or Firm* — Verrill Dana, LLP; Robert L. Hover

(57) ABSTRACT

A modular, non-metallic enclosure with a first enclosure having an open end between first and second side panels and a second enclosure having an open end between third and fourth side panels. At the open end of the first enclosure, the first and second side panels each include a guide rail having a male guiderail member and a female guiderail channel. At the open end of the second enclosure, the third and fourth side panels each include a guide rail having a male guiderail member and a female guiderail channel. The male guiderail member/female guiderail channel of the first sidewall are configured to engage with the opposite of the male guiderail member/female guiderail channel of the third side wall. The male guiderail member/female guiderail channel of the second sidewall are configured to engage with the opposite of the male guiderail member/female guiderail channel of the fourth side panel.

15 Claims, 12 Drawing Sheets

Related U.S. Application Data

(60) Provisional application No. 62/693,672, filed on Jul. 3, 2018.

(58) Field of Classification Search
CPC . B65D 11/1866; B65D 11/1873; B65D 11/18; Y10S 220/25
See application file for complete search history.

(56) References Cited

U.S. PATENT DOCUMENTS

| | | | |
|---|---|---|---|
| 5,007,550 A * | 4/1991 | Avot | B65D 21/086 220/4.03 |
| 5,066,832 A | 11/1991 | Clarey et al. | |
| 5,574,255 A | 11/1996 | Simmons | |
| 6,359,222 B1 | 3/2002 | Norvelle | |
| 8,680,407 B1 | 3/2014 | Chan | |
| 2014/0097019 A1 | 4/2014 | Chan et al. | |
| 2015/0091420 A1 | 4/2015 | Liu | |
| 2015/0289388 A1 | 10/2015 | Conway et al. | |
| 2017/0332498 A1 | 11/2017 | Larson | |
| 2017/0373426 A1 | 12/2017 | Kaplan | |

FOREIGN PATENT DOCUMENTS

| | | |
|---|---|---|
| CN | 104519686 A | 4/2015 |
| CN | 105024195 A | 11/2015 |
| EA | 200801914 A1 | 4/2009 |

OTHER PUBLICATIONS

NetSELECT® Products Network Enclosures Structured Wiring. Datasheet [online]. Hubbell Wiring Device-Kellems [retrieved on Mar. 22, 2018]. Retrieved from <http://https://images.tradeservice.com/9ETBOIYK8205G6UU/ATTACHMENTS/DIR100132/HUBPREE01397_W17.pdf>.

International Search Report and Written Opinion, dated Sep. 13, 2019, received in international patent application No. PCT/US2019/040475, 6 pages.

CNIPA Second Office Action with a supplementary search report dated Mar. 29, 2022.

* cited by examiner

MODULAR WALL MOUNT ENCLOSURE

CROSS-REFERENCE TO RELATED APPLICATIONS

This application is a Continuation of U.S. application Ser. No. 16/502,223, filed Jul. 3, 2019, entitled "MODULAR WALL MOUNT ENCLOSURE," now U.S. Pat. No. 11,375,627, and claims the benefit of priority to U.S. Provisional Application No. 62/693,672, filed Jul. 3, 2018, entitled "MODULAR WALL MOUNT ENCLOSURE," all of which is incorporated herein by reference in their entirety.

FIELD OF THE INVENTION

This invention relates to an enclosure for voice, data and video wiring and equipment and more particularly to a non-metallic modular enclosure utilizing multiple standard size enclosures combined with an interlocking sliding joint mechanism.

BACKGROUND OF THE INVENTION

Enclosures for terminating wires from outlets, for distributing wires, and for mounting equipment, such as routers, for voice, data and video are used in residences, offices and factories. Such enclosures are used in new installations and retrofits and can be surface mounted or recessed by mounting between wall studs. Such enclosures are often made of metal and come in a variety of standard sizes, such as: 14", 21", 28" and 42" lengths. While the array of different size metal enclosures provide various options to choose from, depending on the amount of wiring and equipment needed to be housed for a particular application, the metal negatively impacts the performance of the electrical equipment, in particular WiFi operation.

Other enclosures are manufactured using a non-metallic material, such as plastic, which provide better electrical performance; however, there is little variety in the size of the equipment due to the fact that for each different size dedicated mold tooling, which is expensive and requires special equipment and facilities, is required. This is only justified when the market requirement for larger enclosures is significant.

To address this problem plastic enclosures using separate modules that can be combined to provide a larger size enclosure for mounting on a wall have been developed. The modules are combined to form two-gang or larger assemblies. However, the interlock mechanism to connect the modules is mechanically complex, making it difficult to manufacture and assemble. There is therefore a need for a non-metallic modular enclosure assembly having a simple and easy to use interlocking mechanism for connecting modules.

SUMMARY OF INVENTION

It is an object of the invention to provide a non-metallic modular enclosure assembly having a simple and easy to use interlocking mechanism Other benefits and advantages of the present invention over existing systems will be readily apparent from the Brief Summary of the Invention and Detailed Description to follow. One skilled in the art will appreciate that the present teachings can be practiced with embodiments other than those summarized or disclosed below.

In one aspect, the invention includes a modular, non-metallic enclosure with first non-metallic enclosure member having a first base panel, a first side panel, a second side panel opposing the first side panel, and a first end panel. The first base panel includes an internal surface from which extend the first and second side panels on opposite sides of the internal surface and the first end panel extends from an end of the internal surface and interconnects the first and second side panels forming a closed end of the first non-metallic enclosure member. Opposite the closed end there is an open end of the first non-metallic enclosure member between the first and second side panels. There is a second non-metallic enclosure member having a second base panel, a third side panel, a fourth side panel opposing the third side panel, and a second end panel. The second base panel includes an internal surface from which extend the third and fourth side panels on opposite sides of the internal surface and the second end panel extends from an end of the internal surface and interconnects between the third and fourth side panels forming a closed end of the second non-metallic enclosure member. Opposite the closed end there is an open end of the second non-metallic enclosure member between the third and fourth side panels. At the open end of the first non-metallic enclosure member, the first and second side panels each include a guide rail, each guide rail having a male guiderail member and a female guiderail channel. At the open end of the second non-metallic enclosure member the third and fourth side panels each include a guide rail, each guide rail having a male guiderail member and a female guiderail channel. The male guiderail member and the female guiderail channel of the first sidewall are configured to slideably engage with the opposite of the male guiderail member and the female guiderail channel of the third side wall, thereby forming a first sliding joint. The male guiderail member and the female guiderail channel of the second sidewall are configured to slideably engage with the opposite of the male guiderail member and the female guiderail channel of the fourth side panel, thereby forming a second sliding joint.

In other aspects of the invention, one or more of the following features may be included. The guide rails of the first non-metallic enclosure member may have a length extending in an orthogonal direction relative to the internal surface of the first base panel and the guide rails of the second non-metallic enclosure member may have a length extending in an orthogonal direction relative to the internal surface of the second base panel. The guide rails of the first non-metallic enclosure member may be configured to receive at a top of the first and second side walls the guide rails of the second non-metallic enclosure member at a bottom of the third and fourth side walls, respectively. The male guiderail member and the female guiderail channel on each of the first and second side panels may be integrated. The male guiderail member and the female guiderail channel on each of the third and fourth side panels may be integrated. The male guiderail member and the female guiderail channel on each of the first and second side panels may extend at least partially beyond the open end of the first non-metallic enclosure member and the internal surface of first base panel. The male guiderail member and the female guiderail channel on each of the third and fourth side panels may be positioned within the open end of the second non-metallic enclosure member and on the internal surface of first base panel. Each male guiderail member may be tapered in width along its length from the top of the first and second side panels to a base of the first and second side panels and each female guiderail channel on each of the first and second side panels may have a consistent rectangular cross-sectional shape along its length. The male guiderail member and the female guiderail channel on each of the third and fourth side panels may have a consistent rectangular cross-sectional shape along its length. Each male guiderail member may be tapered in width along its length from the top of the first and second side panels to a base of the first and second side panels and each female guiderail channel on each of the first and second side panels may have a consistent rectangular cross-sectional shape. On an external surface of the male guiderail member and proximate the top of each of the first and second side panels there may be included a wedge portion with a sloped surface. The female guiderail channel on each of the third and fourth side panels may have a surface proximate the top of the third and fourth side panels with a surface having a slope complimentary to the sloped surface of the wedge portion to receive the wedge portion of male guide members of the first and second side panels when engaged.

In further aspects of the invention, one or more of the following features may be included. A first trim ring may be affixed to the first non-metallic enclosure member and a second trim ring may be affixed to the second non-metallic enclosure member. A first trim ring may be interconnected to the second trim ring by a first overlap joint and a second overlap joint. The first trim ring may include a first leg member and a second leg member and the second trim ring may include a third leg member and a fourth leg member and the first lap joint may be formed at an intersection of the first and third leg members and the second lap joint may be formed at an intersection of the second and fourth leg members. The first overlap joint may comprise a recessed end portion of the first leg member and an end portion of the third leg member may have a thickness equivalent to a depth of the recess, such that when the end portion of the third leg member is positioned on the recessed portion of the first leg member, a top surface of the first leg member and a top surface of the third leg member are substantially flush. The first overlap joint may further comprise a first joint member and a second joint member on opposite sides of the end portion of the first leg member and the end portion of the third leg member. The first joint member may include a detent on an exterior side surface of the recessed end portion of first leg member and a pocket member with an opening on exterior surface of the end portion of the third leg member, the pocket member may be configured to secure the detent when inserted into the opening. The second joint member may include a cylindrical member projecting from an underside of the end portion of the first leg member and a cylindrical aperture on a top surface of the end portion of the third leg member. The cylindrical aperture may be configured to receive the cylindrical member when inserted therein. The second overlap joint may comprise a recessed end portion of the second leg member and an end portion of the fourth leg member may have a thickness equivalent to a depth of the recess, such that when the end portion of the fourth leg member is positioned on the recessed portion of the second leg member, a top surface of the second leg member and a top surface of the fourth leg member are substantially flush. The second overlap joint may further comprise a third joint member and a fourth joint member on opposite sides of the end portion of the second leg member and the end portion of the fourth leg member. The third joint member may include a detent on an exterior side surface of the recessed end portion of second leg member and a pocket member with an opening on exterior surface of the end portion of the fourth leg member. The pocket member may be configured to secure the detent when inserted into the opening. The fourth joint member may include a cylindrical member projecting from an underside of the end portion of the second leg member and a cylindrical aperture on a top surface of the end portion of the fourth leg member. The cylindrical aperture may be configured to receive the cylindrical member when inserted therein

BRIEF DESCRIPTION OF THE FIGURES

Embodiments of the present disclosure will now be described, by way of example only, with reference to the attached Figures, wherein.

DETAILED DESCRIPTION OF THE INVENTION

Figure 1A:
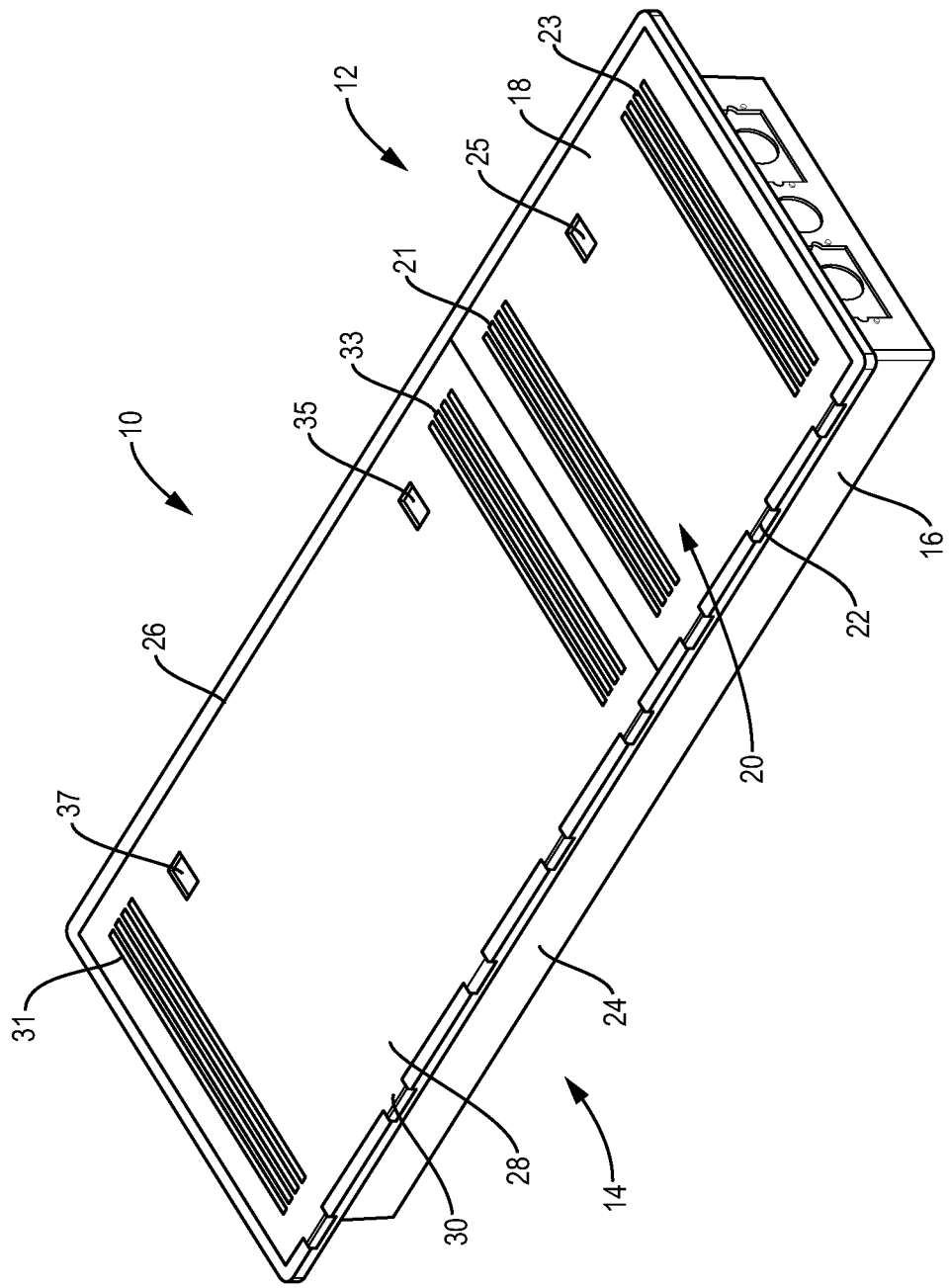
FIG. 1A shows a perspective view of a modular, non-metallic enclosure according to an aspect of the invention.

The disclosure and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments, as the skilled artisan would recognize, even if not explicitly stated herein.

Descriptions of well-known components and processing techniques may be omitted to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

A non-metallic, modular enclosure to be used, for example, for distributing wires and for mounting equipment, such as routers, for voice, data and video, according to an aspect of this invention may be produced by first modifying a standard non-metallic enclosure member, e.g. a 14 in. long plastic enclosure, by not including one of its two end panels and replacing it with an interlocking sliding joint. Then, another standard non-metallic enclosure member, e.g. a 28 in. long plastic enclosure, may also be modified by not including one of its end panels and replacing it with compatible interlocking sliding joints. These modular enclosure members may be made via a mold set change in each standard mold. The mold modification removes one end and creates the interlocking sliding joints. In conjunction with these joints, two interlocking tabs may be formed that engage when the assembly is in its final position. Two flat head screws may secure the two bases together via the tabs. When interconnected, this results in a modular enclosure which, in this example, is 42 in. long without the need for large dedicated 42-inch mold tooling.

In the above example, a 42-inch long trim ring assembly may be created by modifying one end of a 14-inch trim ring and an opposing end of a 28-inch trim ring also via a mold set change. The mold modification removes one end and creates an overlapping joint. The two sections may be secured together with a molded snap feature and two flat head screws. The standard doors for the 14 in. and the 28 in. enclosures may be used in unmodified form.

Figure 1B:
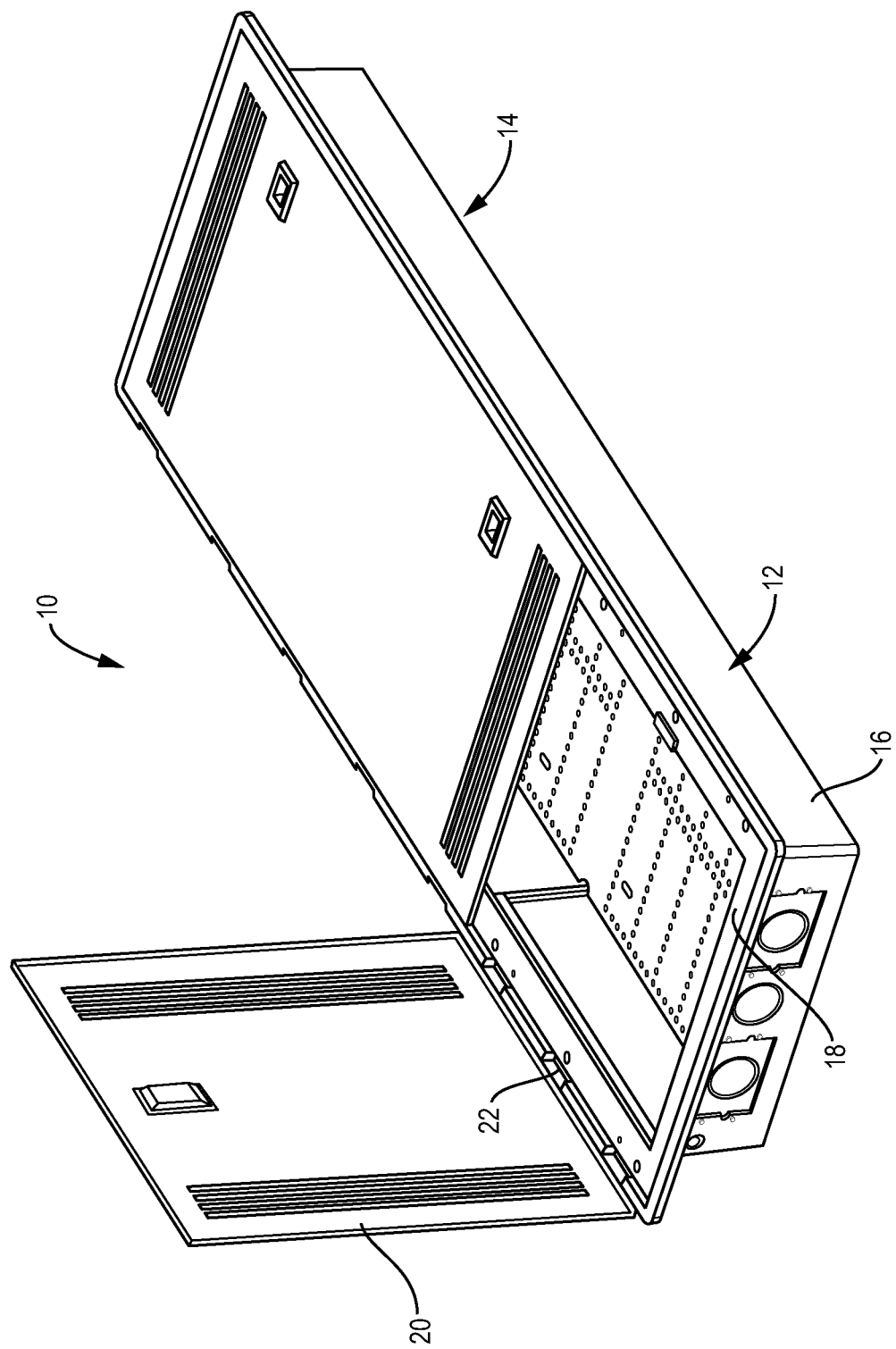
FIG. 1B shows a perspective view, similar to FIG. 1, of a modular, non-metallic enclosure according to an aspect of the invention with one door open and a portion of the interior visible.

Referring to FIGS. 1A and 1B, there is shown a non-metallic modular enclosure 10, according to an aspect of this invention, which comprises a first modular enclosure unit 12 interconnected to a second modular enclosure unit 14. First modular enclosure unit 12 may include a first enclosure base member 16 and a first trim ring 18 disposed about the periphery of and along a top edge of the first enclosure base member 16. There is a first enclosure door 20, which may be interconnected to first trim ring 18 via a plurality of hinges, including hinge 22. First enclosure door may include cooling vents 21 and 23 for providing airflow to cool wiring and components inside the enclosure and a small opening or pocket 25 in door 20 in which a finger may be inserted to open the door.

Second modular enclosure unit 14 may include a second enclosure base member 24 and a second trim ring 26 disposed about the periphery of and along a top edge of the second enclosure base member 24. There may be a second enclosure door 28 which is interconnected to second trim ring 26 via a plurality of hinges, including hinge 30. Second enclosure door 28 may include cooling vents 31 and 33 for providing airflow to cool wiring and components inside the enclosure and openings or pockets 35 and 37 for opening door 28.

In one example, modular enclosure 10 may be a 42 in. long plastic enclosure. This is a standard size for a metallic enclosure, but not for a plastic enclosure. A modular plastic enclosure may be formed by combing a 14 in. first modular enclosure (plastic) with 28 in. second modular enclosure (plastic). Of course, virtually any size plastic enclosure may be produced according to this invention using various sizes and numbers of modular plastic enclosure units and combining them using the sliding interlocking joints disclosed herein.

Figure 2:
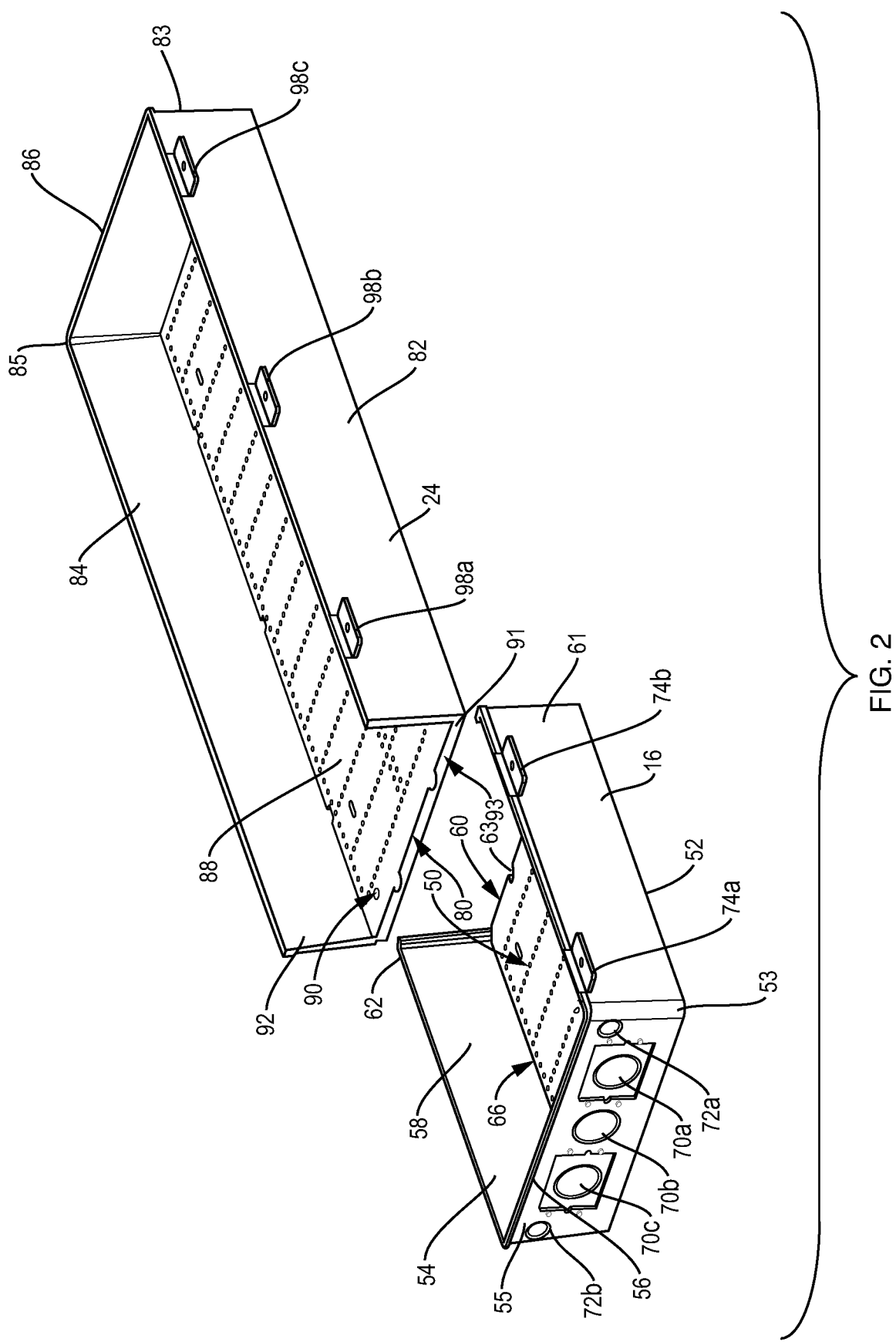
FIG. 2 shows a perspective view of the modular, non-metallic enclosure of FIG. 1B with the two modular enclosure members separated and with the modular trim rings and doors removed.

Referring now to FIG. 2, first enclosure base member 16 and second enclosure base member 24 are shown detached and positioned for the members to be interconnected with the interlocking sliding joints according to this invention.

First enclosure base member 16 constitutes a unitary structure that incorporates a first base panel 50, a first side panel 52, a second side panel 54, opposing the first side panel 52, and a first end panel 56. The first and second side panels 52 and 54 may be connected at their respective first ends 53 and 55 to end panel 56, which together form a U-shaped frame with a first closed end at end panel 56. The panels forming the U-shaped frame may be interconnected to internal surface 58 of base panel 50 about its periphery and extend orthogonally therefrom. The end of the U-shaped frame opposite end panel 56 forms open end 60 defined by end edges 61 and 62 of side panels 52 and 54, respectively, and edge 63 of base panel 50. Open end 60 of the first enclosure base member 16 may be mated with second enclosure base member 24 when the first and second enclosure members are interconnected with the interlocking sliding joints described below.

Surface 58 of base panel 50 may incorporate a plurality of open circular apertures which may be disposed in vertical and horizontal intersecting rows, such as horizontal row 64 and vertical row 66. The distances between open circular apertures which may be chosen to accommodate the attachment of a variety of voice, data, or video equipment modules (not shown), intended for different purposes and having different sizes and configurations. The modules may be provided with snap pins (also not shown) sized to be installed in the apertures. In end panel 56 may be included several entry ports, such as ports 70*a-c* and 72*a-b* formed as "knock-outs", which may be used to feed wiring into and out of the enclosure. Additionally, there may be included brackets, such as brackets 74*a-b*, which extend horizontally out from the top edge of side panel 52 and are used to secure the first enclosure base member 16 to wall studs (not shown) via screws when installed. Although not visible in this view two additional brackets may be included on the top edge of side panel 54.

Second enclosure base member 24 constitutes a unitary structure that incorporates a first base panel 80, a first side panel 82, a second side panel 84, opposing the first side panel 82, and a first end panel 86. The first and second side panels 82 and 84 may be connected at their respective first ends 83 and 85 to end panel 86, which together form a U-shaped frame with a first closed end at end panel 86. The panels forming the U-shaped frame may be interconnected to internal surface 88 of base panel 80 about its periphery and extend orthogonally therefrom. The end of the U-shaped frame opposite end panel 86 forms open end 90 defined by end edges 91 and 92 of side panels 82 and 84, respectively, and edge 93 of base panel 80. Open end 90 of the second enclosure base member 24 may be mated with open end 60 of first enclosure base member 16 when the first and second enclosure members are interconnected with the interlocking sliding joints described below.

Surface 88 of base panel 80 may incorporate a plurality of open circular apertures disposed in vertical and horizontal intersecting rows, such as horizontal row 94 and vertical row 96. As indicated above, the distances between open circular apertures may be chosen to accommodate the attachment of a variety of equipment modules which may be installed with snap pins sized to be installed in the apertures. There may be included brackets, such as brackets 98*a-c*, which extend horizontally out from the top edge of side panel 82 and may be used to secure the second enclosure base member 24 to wall studs via screws when installed. Although not visible in this view, three additional brackets may be included on the top edge of side panel 84.

Figure 3:
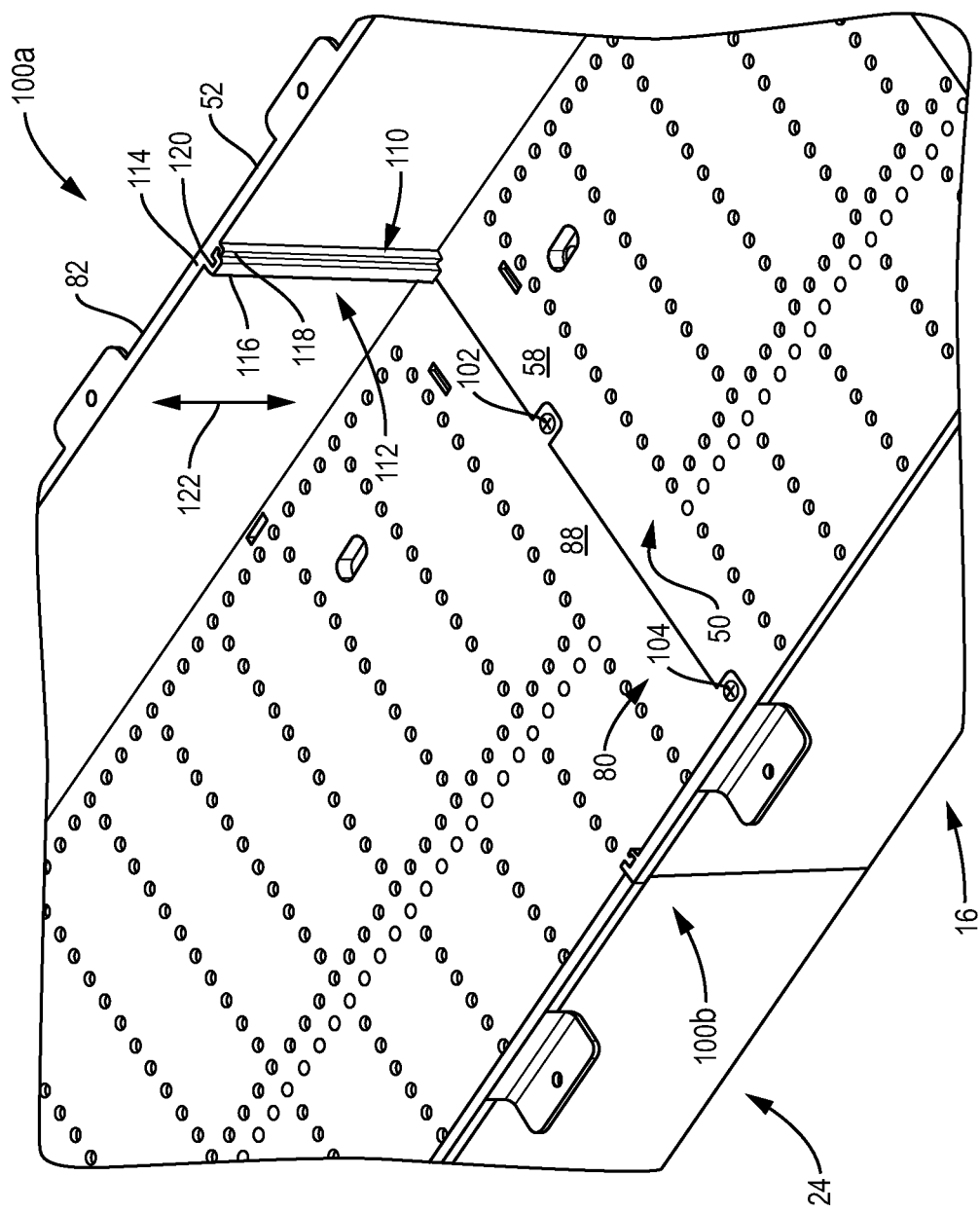
FIG. 3 shows a top plan view of the two modular enclosure members of FIG. 2 interconnected with the interlocking sliding joint mechanism according to an aspect of the invention.
Figure 4:
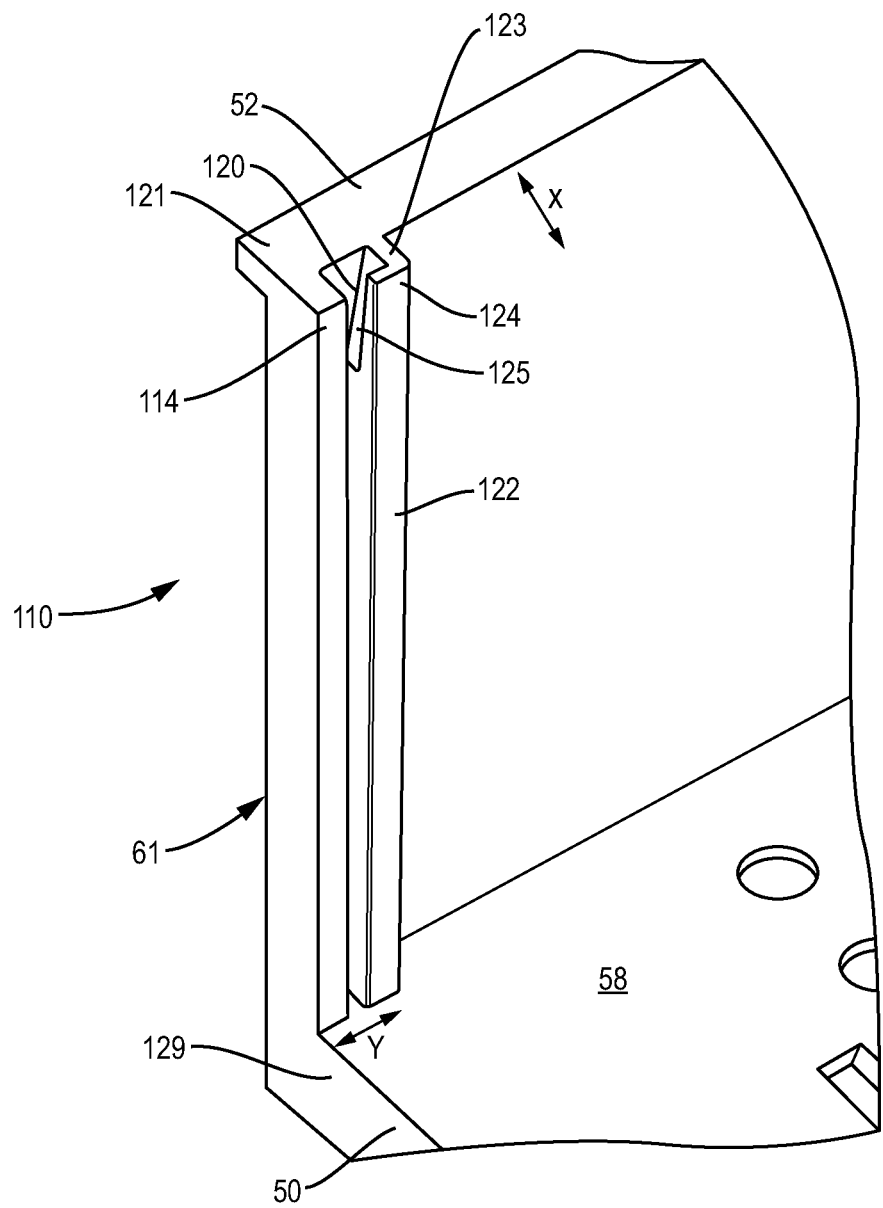
FIG. 4 shows a perspective view of one of the guide rails of the sliding joint of FIG. 3.

The interlocking sliding joints according to an aspect of this invention are depicted in FIGS. 3-5. FIG. 3 is a perspective view of the first enclosure base member 16 and second enclosure base member 24 interconnected with the interlocking sliding joints 100*a* and 100*b* located on either side of the enclosure. Tabs 102 and 104, which may be integrally formed as part of surface 88 of base panel 80, mate with and are seated on grooves (not visible in this figure) formed in surface 58 of base panel 50. The grooves may have a depth equal to the thickness of the tabs and may be aligned therewith, so that when they are engaged the top surface on tabs 102 and 104 are flush with surface 58. Screws may be inserted through holes in the tabs and grooves to fasten the base panels 50 and 80 together near the central region of the first enclosure base member 16 and second enclosure base member 24 to enhance the interconnection provided by interlocking sliding joints 100*a* and 100*b*.

Continuing to refer to FIG. 3, interlocking sliding joint 100*a* is shown to include guide rail 110 integrally formed at end edge 61 of first side panel 52 of first enclosure base member 16, which may extend orthogonally outward from the internal surface 58 of base panel 50 to the top edge of first side panel 52. Interlocking sliding joint 100*a* may also include a complementary guide rail 112 integrally formed at end 91 of second side panel 82 of second enclosure base member 24, which may extend orthogonally outward from the internal surface 88 of base panel 90 to the top edge of second side panel 82. Each guide rail may comprise a male guiderail member and a female guiderail channel and the male guiderail member of one guiderail may interlock with the female guiderail channel of the other guiderail as they are brought together in sliding engagement.

For example, male guide member 114 of the guide rail 110 may be inserted into the corresponding female guide channel 116 of guide rail 112, while simultaneously male guide member 118 of the guide rail 112 may be inserted into the corresponding female guide channel 120 of guide rail 110. As the first and second enclosure base members 16 and 24 are brought closer to each other in the vertical direction (i.e. orthogonal to surfaces 58 and 88 of base panels 50 and 80, respectively), indicated by arrow 122, the guide rails 110 and 112 move/slide relative to each other until the guide rails are fully interconnected at which point the top edges of side panels 52 and 82 and the base panel surfaces 58 and 88 of the first and second base members are aligned. Interlocking sliding joint 100*b* is not described in detail, as it may have the same construction and operation as interlocking sliding joint 100*a*.

Figure 5A:
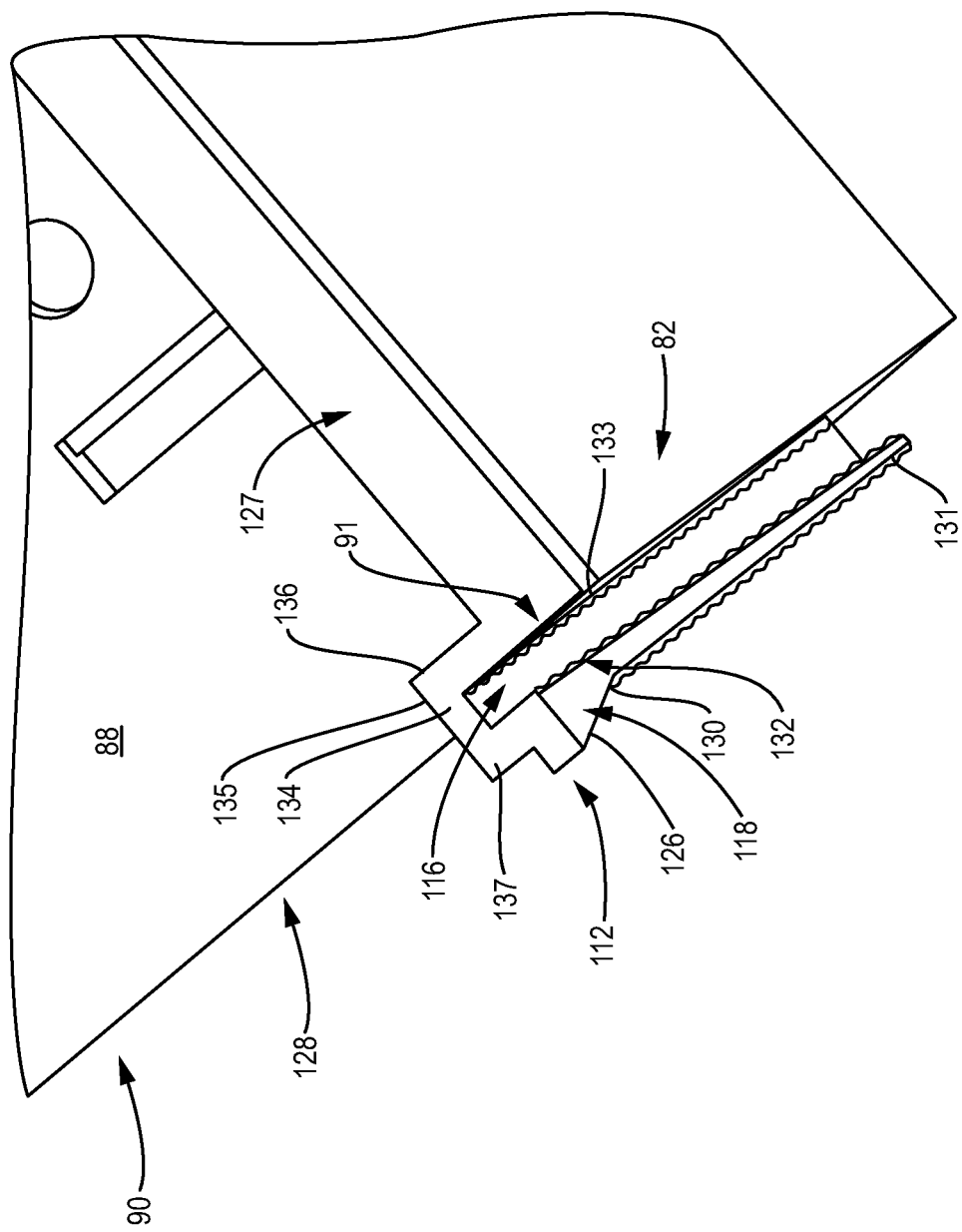
FIG. 5A shows an exterior perspective view of the other of the guide rails of the sliding joint of FIG. 3.
Figure 5B:
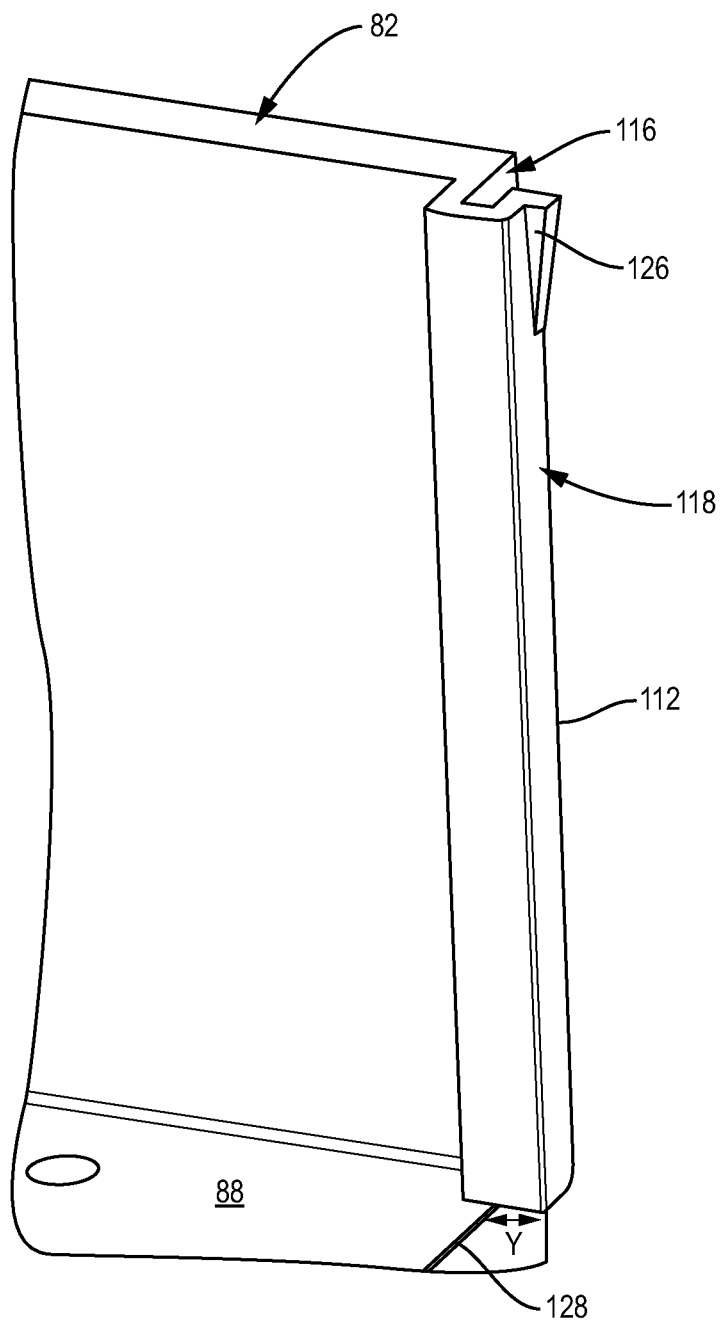
FIG. 5B shows an interior perspective view of the guide rail of FIG. 5A.

Referring to FIGS. 4 and 5, the construction of interlocking sliding joint 100*a* is shown in more detail. Guide rail 110, FIG. 4, may include male guide member 114, which is formed at edge 61 of first side panel 52 and may project inwardly toward the center of the enclosure, in a direction perpendicular to the first side panel 52 a distance "X", which, in this example, may be approximately 0.15 in. Male guide member may also extend in a perpendicular direction from the base panel surface 58 to top edge 121 of first side panel 52. Female guide channel 120 of guide rail 110 is, on one side, defined by internal surface of male guide member 114 and, on the side opposite the surface of male guide member 114, by rail 122 which may also extend in a perpendicular direction from the base panel surface 58 to top edge 121 of first side panel 52. Rail 122 may include a first member 123, which may project inwardly toward the center of the enclosure in a direction perpendicular to the first side panel 52 a distance "X", as does male guide member 114. Rail 122 may include a second member 124, which may project along its length in a direction perpendicular to the length of first member 123 toward male guide member 114. Formed on inner surface of first member 123 of rail 122 proximate top edge 121 is an angled surface portion 125, which is configured to receive a complementarily angled male member 126 (FIGS. 5A and 5B).

Guide rail 112, FIGS. 5A and 5B, is shown to include male guide member 118, which is formed at edge 91 of side panel 82 of second enclosure base member 24 and extends in a perpendicular direction from top edge 127 of side panel 82 toward a plane defined by base panel surface 88. Male guide member 118 does not intersect with base panel surface 88, but rather it overhangs base panel surface 88 a distance "Y", which, in this example, is approximately 0.185 in., from edge 128 of base panel surface 88. The female channel 120 of guide rail 110 is positioned a distance "Y" from edge 129 of base panel surface 58 of base panel 50, such that when male guide member 118 is inserted into female guide channel 120 and interconnected, edges 128 and 129 of base panel surfaces 88 and 58, respectively, abut.

Referring to FIG. 5A, male guide member 118 includes angled male member 126 proximate top edge 127 of side panel 82, which engages with complementary angled surface portion 125 (FIG. 4) within female guide channel 120 when male guide member 118 is inserted into female guide channel 120. Beneath angled male member 126, male guide member 118 tapers in width from point 130 to the end 131. The tapering width allows for easier initial insertion of the male guide member 118 into female guide channel 120 and the gradual widening to a width at location 130 substantially equal to the width of the female guide channel 120 allows for a snug fit at location 130 and at angled male member 126 when fully interconnected. It should be noted that end 131 of male guide member terminates in the plane defined by bottom panel surface 88, such that when male guide member 118 is inserted into female guide channel 120 end 131 of male guide member is seated on back panel surface 58.

Continuing to refer to FIGS. 5A and 5B, guide rail 112, also includes female guide channel 116 which is configured to receive male guide member 114 of guide rail 110. Female guide channel 116 is, on one side, defined by a surface 132 of male guide member 118 and, on the side opposite the surface 132 of male guide member 118, by surface 133 at the edge 91 of side panel 82 and finally by surface 134 of rail wall 135. Rail wall 135 is connected at a first end to rail wall 136 at a perpendicular angle and rail wall 136 is itself connected to side panel 82 at a perpendicular angle. Rail wall 136 extends in a perpendicular direction from the side panel 82. Rail wall 135 is connected at a second end to rail wall 137 at a perpendicular angle which is itself connected to male guide member 118.

Figure 6:
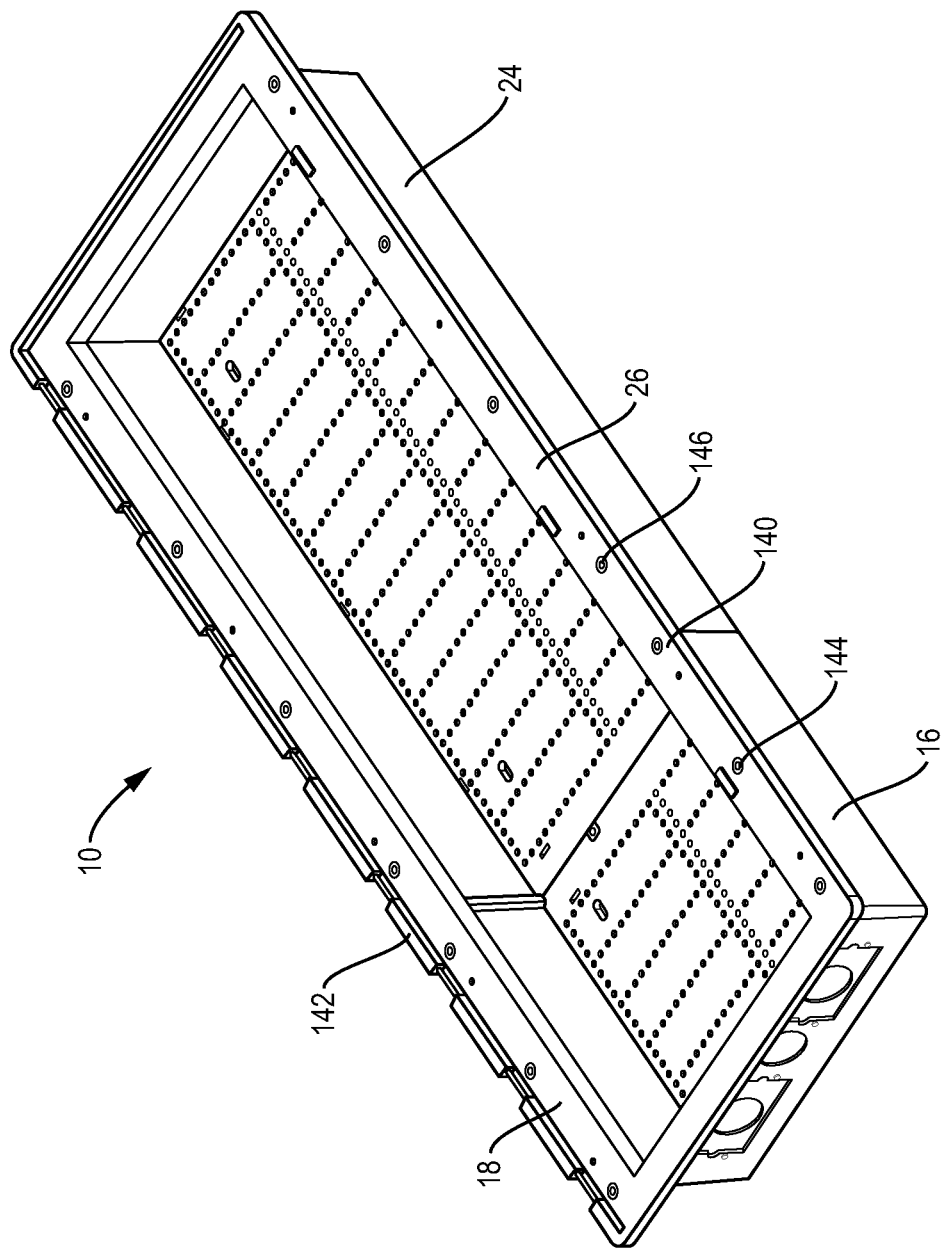
FIG. 6 shows a perspective view of the two modular enclosure members of FIG. 2 interconnected and with the modular trim ring assemblies installed.

Modular enclosure 10 is shown in FIG. 6 in a perspective view with first trim ring 18
    and second trim ring 28 installed on first enclosure base member 16 and second enclosure base member 24, respectively, but with enclosure doors 20 and 28 removed. The trim rings are formed using the molds and tooling for the standard size enclosure but they are modified to create an open end to align with the open end of the enclosure base members and to include an overlap joint to join with another modified trim ring. The trim rings are joined to the top edges of the enclosure base members via screws, such as screws 144 and 146. The overlap joints 140 and 142 are located on opposite sides of enclosure 10.

Figure 7:
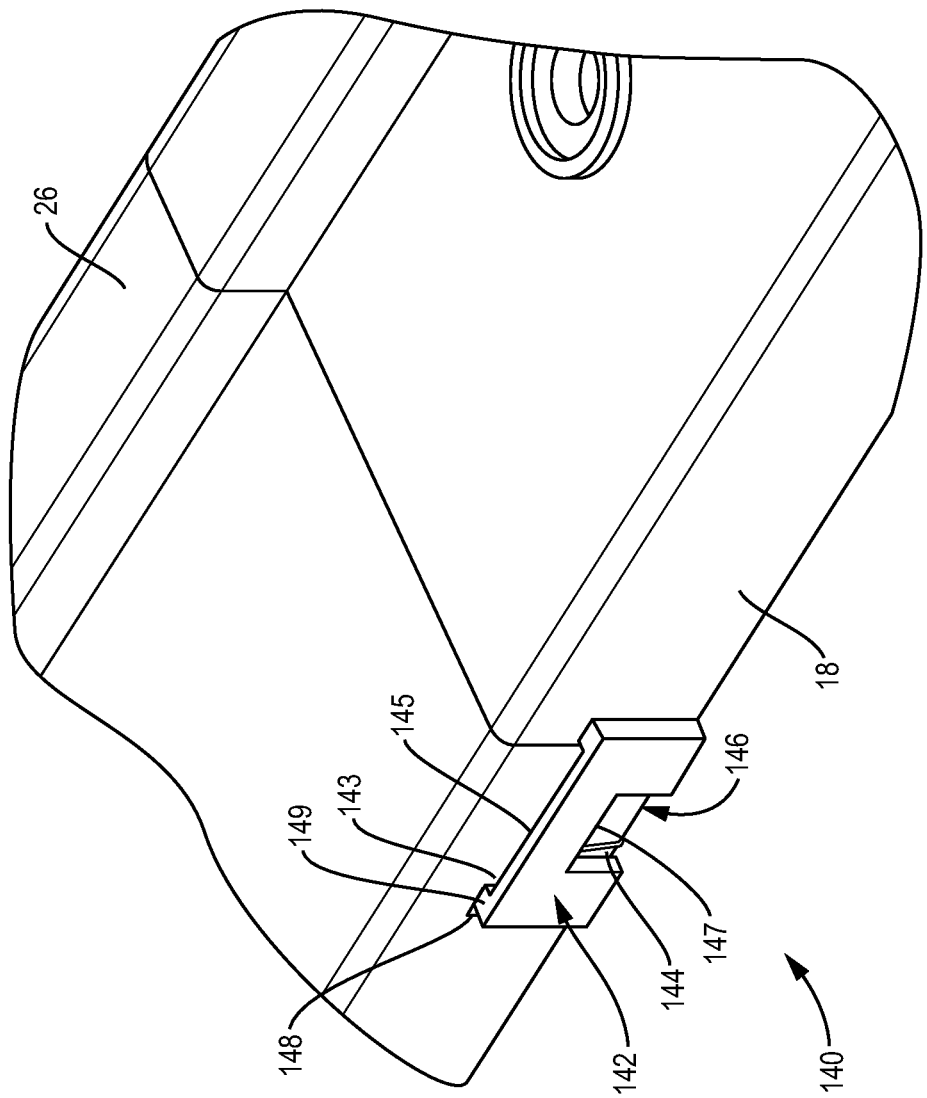
FIG. 7 shows an enlarged interior perspective view of the overlapping joint of the modular trim ring assemblies of FIG. 6.
Figure 8A:
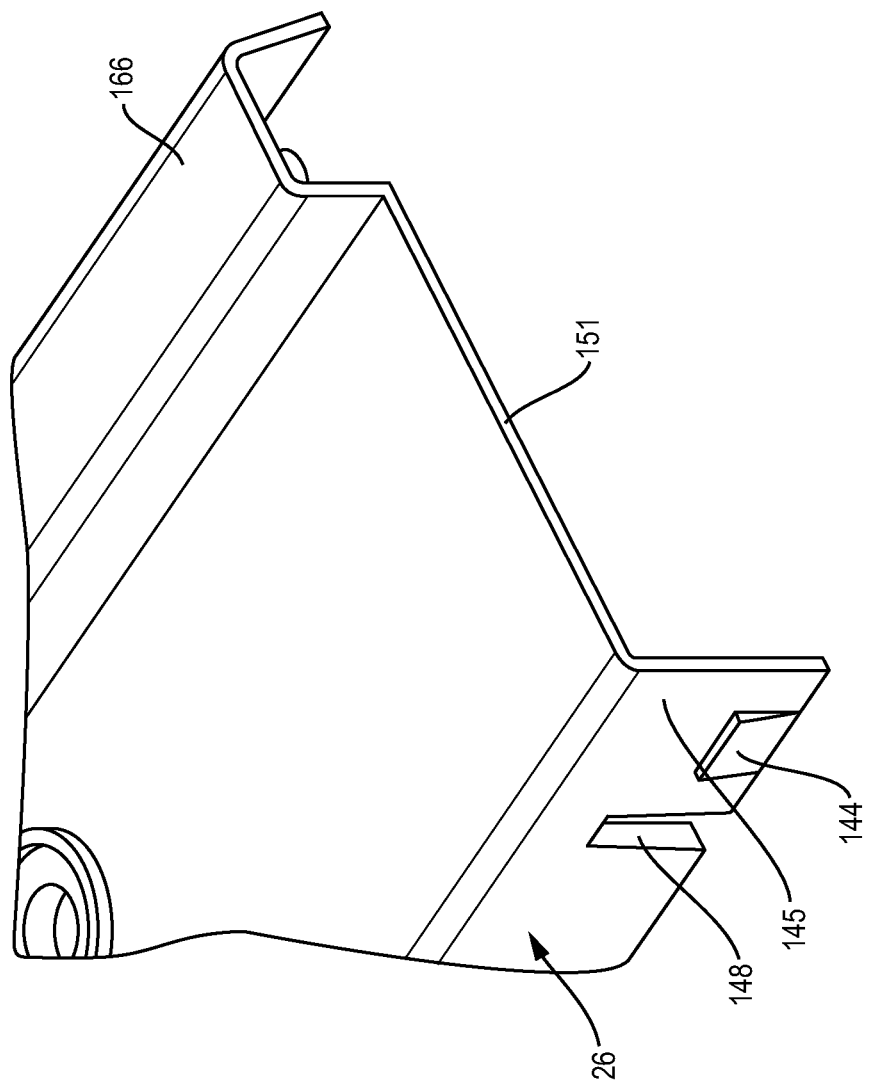
FIG. 8A shows an interior perspective view of an end of one of the trim rings.
Figure 8B:
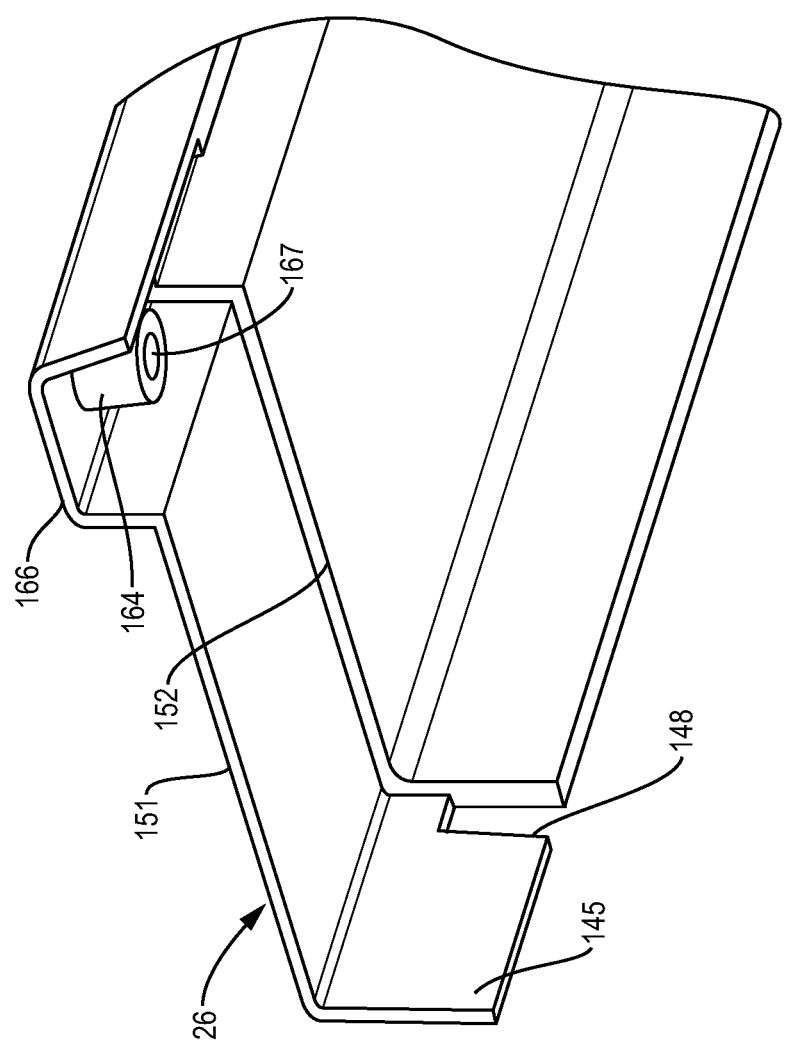
FIG. 8B shows a perspective view of the underside of the trim ring of FIG. 8A from the exterior.
Figure 9:
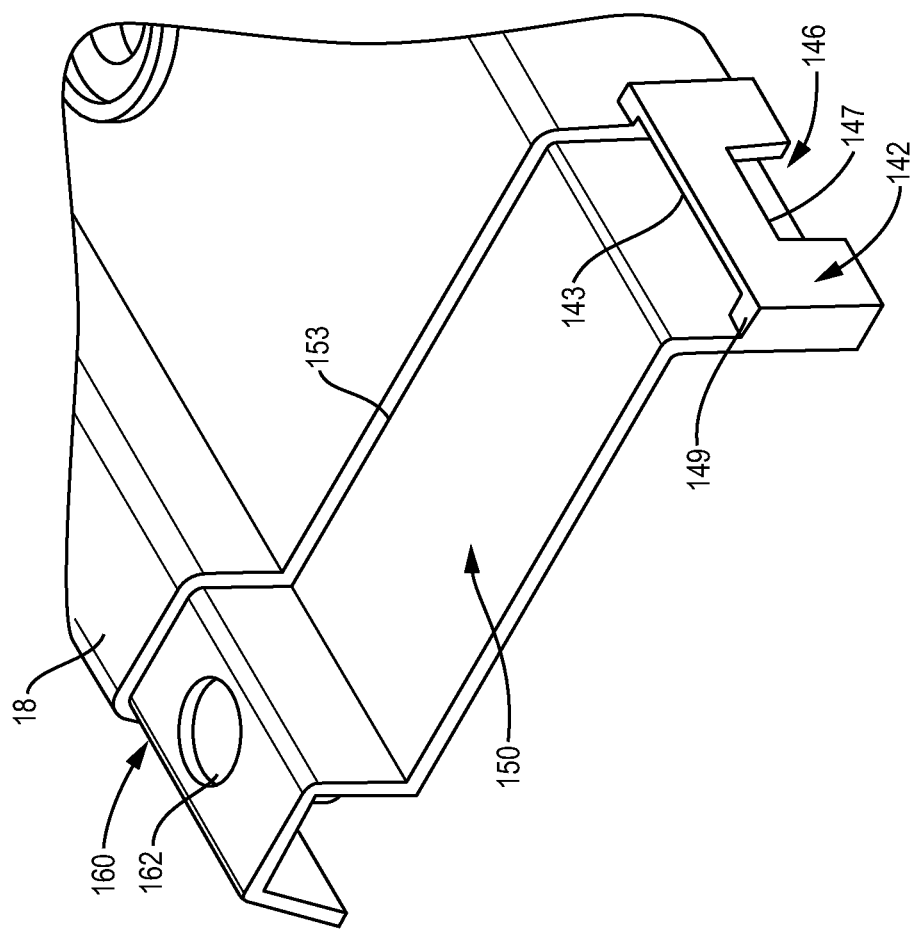
FIG. 9 shows an interior perspective view of an end of the trim ring which mates with the trim ring shown in FIGS. 8A and 8B.

The overlap joint 140 is shown in more detail in FIGS. 7-9. Overlap joint 142 is the same construction as overlap joint 140 and is therefore not described herein in detail. Overlap joint 140, is formed by overlapping end portions of first trim ring 18 and second trim ring 26. On the interior side, the trim rings may include a molded snap mechanism formed of pocket member 142, FIG. 7, on the end of trim ring 18, which includes an opening 143 configured to receive a detent 144 formed on a leg 145 at the end of trim ring 26. When leg 145 is inserted into opening 143 of pocket member 142, the detent 144 is initially compressed and then, when it is positioned in alignment with opening 146 in pocket member 142, detent 144 extends into opening 146 and catches on underside surface 147 of pocket member 142 to secure the two trim rings in place. There may be a slit 148 formed in the sidewall of trim ring 26 to accommodate leg 149 of pocket member 142.

Referring to FIG. 9, the end of trim ring 18 may include a recessed surface 150, which extends across the width of the trim ring at a depth equal to the thickness 151 of trim ring 26 (FIGS. 8A and 8B), such that when the end of trim ring 26 is placed on top of recessed surface 150 of trim ring 18, the top surfaces of the trim rings are flush. There is an edge 152 (FIG. 8B) on the underside of trim ring 26, which may abut edge 153 on trim ring 18 as the trim rings are overlapped. On the exterior side of trim ring 18 there may be a raised portion 160 which includes a cylindrical aperture 162 configured to received cylindrical member 164, FIG. 8B, in the underside of raised portion 166 in trim ring 26 when the end of trim ring 26 is placed on the end of trim ring 18. Referring to FIG. 8B, there may be a threaded opening 167 in cylindrical member 164 which may receive a screw when inserted through an opening (not shown) at the base of cylindrical aperture 162 to secure the trim rings together on their exterior sides.

Once the trim rings are installed, the first enclosure door 20 and the second enclosure door 28 may be installed as shown in FIGS. 1A and 1B and the non-metallic, modular enclosure according to an aspect of this invention may be used.

While the foregoing description of the invention enables one of ordinary skill to make and use what is considered presently to be the best mode thereof, those of ordinary skill will understand and appreciate the existence of variations, combinations, and equivalents of the specific embodiments and examples herein. The above-described embodiments of the present invention are intended to be examples only. Alterations, modifications and variations may be effected to the particular embodiments by those of skill in the art without departing from the scope of the invention, which is defined solely by the claims appended hereto. The invention is therefore not limited by the above described embodiments and examples.

I claim:

1. A modular, non-metallic enclosure, comprising:
a first non-metallic enclosure member having a first base panel, a first side panel, a second side panel opposing the first side panel, and a first end panel; wherein the first base panel includes an internal surface from which extend the first and second side panels on opposite sides of the internal surface and the first end panel extends from an end of the internal surface and interconnects the first and second side panels forming a closed end of the first non-metallic enclosure member, opposite the closed end there is an open end of the first non-metallic enclosure member between the first and second side panels;

a second non-metallic enclosure member having a second base panel, a third side panel, a fourth side panel opposing the third side panel, and a second end panel; wherein the second base panel includes an internal surface from which extend the third and fourth side panels on opposite sides of the internal surface and the second end panel extends from an end of the internal surface and interconnects between the third and fourth side panels forming a closed end of the second non-metallic enclosure member, opposite the closed end there is an open end of the second non-metallic enclosure member between the third and fourth side panels; and a first trim ring attached to the first non-metallic enclosure member and a second trim ring attached to the second non-metallic enclosure member, the first trim ring interconnected to the second trim ring by a first overlap joint and a second overlap joint, wherein the first trim ring includes a first leg member and a second leg member and the second trim ring includes a third leg member and a fourth leg member and the first overlap joint is formed at an intersection of the first and third leg members and the second overlap joint is formed at an intersection of the second and fourth leg members;

wherein at the open end of the first non-metallic enclosure member, the first and second side panels each include a guide rail;

wherein at the open end of the second non-metallic enclosure member, the third and fourth side panels each include a guide rail;

wherein the guide rail of the first side panel is configured to slidably engage with the guide rail of the third side panel and wherein the guiderail of the second side panel is configured to slidably engage with the guiderail of the fourth side panel;

wherein the first overlap joint comprises a recessed end portion of the first leg member and an end portion of the third leg member having a thickness equivalent to a depth of the recess, such that when the end portion of the third leg member is positioned on the recessed portion of the first leg member, a top surface of the first leg member and a top surface of the third leg member are substantially flush, wherein the top surface of the first leg member being opposite the first base panel and the top surface of the third leg member being opposite the second base panel; and wherein the first overlap joint further comprises a first joint member and a second joint member on opposite sides of the end portion of the first leg member and the end portion of the third leg member; wherein the first joint member includes a detent on an exterior side surface of the recessed end portion of first leg member and a pocket member with an opening on an exterior surface of the end portion of the third leg member, the pocket member configured to secure the detent when inserted into the opening.

2. The modular, non-metallic enclosure of claim 1 wherein the guide rails of the first non-metallic enclosure member have a length extending in an orthogonal direction relative to the internal surface of the first base panel and the guide rails of the second non-metallic enclosure member have a length extending in an orthogonal direction relative to the internal surface of the second base panel, and wherein the guide rails of the first non-metallic enclosure member are configured to receive, at a top edge of the first and second side panels opposite a base of the first and second side panels, the guide rails of the second non-metallic enclosure member at a base of the third and fourth side panels, respectively.

3. The modular, non-metallic enclosure of claim 1 wherein:
at the open end of the first non-metallic enclosure member, each of the guide rails of the first, second, third and fourth side panels includes a male guiderail member and a female guiderail channel;
wherein the male guide rail member and the female guiderail channel of the first side panel are configured to slidably engage with the opposite of the male guide rail member and the female guiderail channel of the third side panel, thereby forming a first sliding joint and wherein the male guiderail member and the female guiderail channel of the second side panel are configured to slidably engage with the opposite of the male guiderail member and the female guiderail channel of the fourth side panel, thereby forming a second sliding joint.

4. The modular, non-metallic enclosure of claim 3 wherein the male guiderail member and the female guiderail channel on each of the first and second side panels are integrated.

5. The modular, non-metallic enclosure of claim 4 wherein the male guiderail member and the female guiderail channel on each of the third and fourth side panels are integrated.

6. The modular, non-metallic enclosure of claim 5 wherein the male guiderail member and the female guiderail channel on each of the first and second side panels extend at least partially beyond the open end of the first non-metallic enclosure member and the internal surface of first base panel.

7. The modular, non-metallic enclosure of claim 6 wherein the male guiderail member and the female guiderail channel on each of the third and fourth side panels are positioned within the open end of the second non-metallic enclosure member and on the internal surface of first base panel.

8. The modular, non-metallic enclosure of claim 7 wherein each male guiderail member is tapered in width along its length from a top edge of the first and second side panels to a base of the first and second side panels and each female guiderail channel on each of the first and second side panels has a consistent rectangular cross-sectional shape along its length, wherein the top edge of the first and second side panels being opposite the base of the first and second side panels.

9. The modular, non-metallic enclosure of claim 8 wherein the male guiderail member and the female guiderail channel on each of the third and fourth side panels have a consistent rectangular cross-sectional shape along its length.

10. The modular, non-metallic enclosure of claim 9 wherein on an external surface of the male guiderail member and proximate the top edge of each of the first and second side panels there is included a wedge portion with a sloped surface.

11. The modular, non-metallic enclosure of claim 10 wherein the female guiderail channel on each of the third and fourth side panels has a surface proximate a top edge of the third and fourth side panels having a slope complementary to the sloped surface of the wedge portion to receive the wedge portion of male guide members of the first and second side panels when engaged, wherein the top edge of the third and fourth side panels being opposite a base of the third and fourth side panels.

12. The modular, non-metallic enclosure of claim 1 wherein the second joint member includes a cylindrical member projecting from an underside of the end portion of the first leg member and a cylindrical aperture on a top surface of the end portion of the third leg member, the cylindrical aperture configured to receive the cylindrical member when inserted therein.

13. The modular, non-metallic enclosure of claim 12 wherein the second overlap joint comprises a recessed end portion of the second leg member and an end portion of the fourth leg member having a thickness equivalent to a depth of the recess, such that when the end portion of the fourth leg member is positioned on the recessed portion of the second leg member, a top surface of the second leg member and a top surface of the fourth leg member are substantially flush, wherein the top surface of the second leg member being opposite the first base panel and the top surface of the fourth leg member being opposite the second base panel.

14. The modular, non-metallic enclosure of claim 13 wherein the second overlap joint further comprises a third joint member and a fourth joint member on opposite sides of the end portion of the second leg member and the end portion of the fourth leg member; wherein the third joint member includes a detent on an exterior side surface of the recessed end portion of second leg member and a pocket member with an opening on exterior surface of the end portion of the fourth leg member, the pocket member configured to secure the detent when inserted into the opening.

15. The modular, non-metallic enclosure of claim 14 wherein the fourth joint member includes a cylindrical member projecting from an underside of the end portion of the second leg member and a cylindrical aperture on the top surface of the end portion of the fourth leg member, the cylindrical aperture configured to receive the cylindrical member when inserted therein.

* * * * *